(12) United States Patent
Lin et al.

(10) Patent No.: US 8,669,637 B2
(45) Date of Patent: Mar. 11, 2014

(54) INTEGRATED PASSIVE DEVICE SYSTEM (75) Inventors: Yaojian Lin, Singapore (SG); Haijing Cao, Singapore (SG); Robert Charles Frye, Piscataway, NJ (US); Pandi Chelvam Marimuthu, Singapore (SG)

(73) Assignee: Stats ChipPac Ltd., Singapore (SG)

( * ) Notice: Subject to any disclaimer, the term of this patent is extended or adjusted under 35 U.S.C. 154(b) by 0 days.

(21) Appl. No.: 11/553,949

(22) Filed: Oct. 27, 2006

(65) Prior Publication Data
US 2007/0114634 A1 May 24, 2007

Related U.S. Application Data (60) Provisional application No. 60/596,926, filed on Oct. 29, 2005.

(51) Int. Cl.
*H01L 27/01* (2006.01)

(52) U.S. Cl.
USPC ........... 257/528; 257/531; 257/532; 257/536; 257/E21.022; 257/E27.114; 438/381

(58) Field of Classification Search
USPC .......... 438/381, 382, 393, 396; 257/528, 531, 257/532, 533, 535–538, E21.022, E27.114, 257/E27.115, E27.116; 11/381, 382, 393, 11/396
See application file for complete search history.

(56) References Cited

U.S. PATENT DOCUMENTS

| | | | |
|---|---|---|---|
| 5,370,766 A | 12/1994 | Desaigoudar et al. | |
| 5,446,311 A | 8/1995 | Ewen et al. | |
| 5,478,773 A | 12/1995 | Dow et al. | |
| 5,525,546 A * | 6/1996 | Harada et al. | 438/612 |
| 5,813,664 A * | 9/1998 | Pan | 257/303 |
| 6,075,427 A | 6/2000 | Tai et al. | |
| 6,100,574 A * | 8/2000 | Norstrom et al. | 257/532 |
| 6,180,445 B1 * | 1/2001 | Tsai | 438/238 |
| 6,284,617 B1 * | 9/2001 | Erdeljac et al. | 438/381 |
| 6,294,420 B1 * | 9/2001 | Tsu et al. | 438/239 |
| 6,444,920 B1 * | 9/2002 | Klee et al. | 174/260 |
| 6,534,374 B2 * | 3/2003 | Johnson et al. | 438/381 |
| 6,545,225 B2 * | 4/2003 | Copetti et al. | 174/260 |
| 6,636,139 B2 | 10/2003 | Tsai et al. | |
| 6,730,573 B1 * | 5/2004 | Ng et al. | 438/381 |
| 6,761,963 B2 * | 7/2004 | Casper et al. | 428/209 |
| 6,800,534 B2 * | 10/2004 | Hsieh | 438/381 |
| 6,900,708 B2 | 5/2005 | White et al. | |
| 6,902,981 B2 * | 6/2005 | Ng et al. | 438/381 |
| 6,933,614 B2 | 8/2005 | Lee et al. | |
| 7,068,139 B2 | 6/2006 | Harris et al. | |
| 7,084,515 B2 | 8/2006 | Fuller et al. | |
| 7,202,567 B2 * | 4/2007 | Kikuta et al. | 257/758 |
| 7,220,667 B2 | 5/2007 | Yamagata | |
| 2002/0025585 A1 | 2/2002 | Lam et al. | |
| 2002/0180026 A1 | 12/2002 | Liu et al. | |
| 2003/0219956 A1 * | 11/2003 | Mori et al. | 438/393 |
| 2004/0007778 A1 | 1/2004 | Shinozaki et al. | |
| 2005/0017342 A1 | 1/2005 | Morrison | |
| 2005/0017361 A1 * | 1/2005 | Lin et al. | 257/756 |

(Continued)

*Primary Examiner* — Steven J Fulk
*Assistant Examiner* — Eric Ward
(74) *Attorney, Agent, or Firm* — Ishimaru & Associates LLP (57) ABSTRACT An integrated passive device system is disclosed including forming a first dielectric layer over a semiconductor substrate, depositing a metal capacitor layer on the first dielectric layer, forming a second dielectric layer over the metal capacitor layer, and depositing a metal layer over the second dielectric layer for forming the integrated capacitor, an integrated resistor, an integrated inductor, or a combination thereof.

15 Claims, 6 Drawing Sheets

(56) References Cited

U.S. PATENT DOCUMENTS

| | | |
|---|---|---|
| 2005/0054155 A1 | 3/2005 | Song et al. |
| 2005/0127393 A1* | 6/2005 | Kurokawa ................ 257/103 |
| 2005/0212106 A1 | 9/2005 | Kwon et al. |
| 2005/0253255 A1* | 11/2005 | Degani et al. ............... 257/724 |
| 2005/0253257 A1* | 11/2005 | Chiu et al. ................ 257/724 |
| 2007/0114651 A1 | 5/2007 | Marimuthu et al. |
| 2007/0231251 A1 | 10/2007 | Itsuki et al. |
| 2007/0235878 A1 | 10/2007 | Lin et al. |

* cited by examiner

INTEGRATED PASSIVE DEVICE SYSTEM

CROSS-REFERENCE TO RELATED APPLICATION(S)

This application claims the benefit of U.S. Provisional Patent Application Ser. No. 60/596,926 filed Oct. 29, 2005.

The present application contains subject matter related to co-pending U.S. patent application Ser. No. 11/278,002, which is assigned to STATS ChipPAC Ltd.

The present application also contains subject matter related to U.S. patent application Ser. No. 11/538,806, now U.S. Pat. No. 7,851,257, which is assigned to STATS ChipPAC Ltd.

TECHNICAL FIELD

The present invention relates generally to integrated circuit packaging, and more particularly to a system for packaging integrated circuits with integrated passive devices.

BACKGROUND ART

Modern consumer electronics, such as smart phones, personal digital assistants, and location based services devices, as well as enterprise electronics, such as servers and storage arrays, are packing more integrated circuits into an ever shrinking physical space with expectations for decreasing cost. Every new generation of integrated circuits with increased operating frequency, performance and the higher level of large scale integration have underscored the need for back-end semiconductor manufacturing to provide more solutions involving the integrated circuit itself. Numerous technologies have been developed to meet these requirements. Some of the research and development strategies focus on new package technologies while others focus on improving the existing and mature package technologies. Both approaches may include additional processing of the integrated circuits to better match the targeted package.

Miniaturization of electronic circuits is a goal in virtually every field, not only to achieve compactness in mechanical packaging, but also to decrease the cost of manufacture of the circuits. Many digital and analog circuits, including complex microprocessors and operational amplifiers, have been successfully implemented in silicon based integrated circuits (ICs). These circuits typically include active devices such as bipolar transistors and field effect transistors (FETs), diodes of various types, and passive devices such as resistors and capacitors.

One area that remains a challenge to miniaturize are radio frequency (RF) circuits, such as those used in cellular telephones, wireless modems, and other types of communication equipment. The problem is the difficulty in producing good inductors and capacitors in silicon technologies that are suitable for RF applications. Attempts to integrate inductors into silicon technologies have yielded either inductor Q values less than five or required special metalization layers such as gold. The integration of capacitors has been slightly more successful, but the tolerance and size remain an issue. With cost pressures on integrated circuit products, yield issues associated with integrated passive devices and the cost of special metallization layers are not acceptable.

It is well known that the direct current (DC) resistance of a metal line that forms a spiral inductor is a major contributor to the inductor Q degradation. One way to reduce this effect is to use wide metal line-widths, however, this increases the inductor area and the parasitic capacitance associated with the structure. The larger inductor area limits the miniaturization that can be achieved, and the parasitic capacitance associated with the larger area decreases the self-resonance frequency of the inductor, thereby limiting its useful frequency range. Also, since the Q is directly proportional to frequency and inversely proportional to the series loss of the inductor, the metal line widths cannot be chosen arbitrarily large.

Thus, a need still remains for integrated passive device system for radio frequency applications. The demand for wireless products, makes it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated passive device system including forming a first dielectric layer over a semiconductor substrate, depositing a metal capacitor layer on the first dielectric layer, forming a second dielectric layer over the metal capacitor layer, and depositing a metal layer over the second dielectric layer for forming the integrated capacitor, an integrated resistor, an integrated inductor, or a combination thereof.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the semiconductor wafer, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" means the method and the apparatus of the present invention. The term "processing" as used herein includes stamping, forging, patterning, exposure, development, etching, cleaning, and/or removal of the material or laser trimming as required in forming a described structure.

Figure 1:
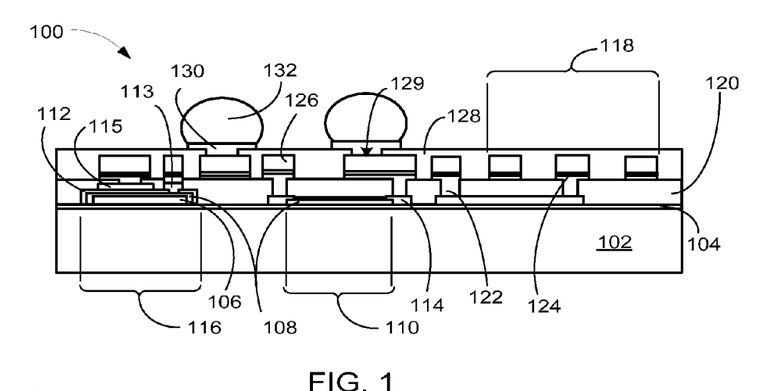
FIG. 1 is a cross-sectional view of an integrated passive device system, in an embodiment of the current invention.

Referring now to FIG. 1, therein is shown a cross-sectional view of an integrated passive device system 100, in an embodiment of the current invention. The cross-sectional view of the integrated passive device system 100 depicts a semiconductor substrate 102, such as a silicon wafer, having a first dielectric layer 104 formed over and in direct contact with the surface of the semiconductor substrate 102. The first dielectric layer 104 may be a silicon dioxide ($SiO_2$) layer. Selective deposition of a metal capacitor (MCAP) layer 106, in direct contact with the first dielectric layer 104, such as an aluminum alloy, forms the bottom plate of a metal-insulator-metal (MIM) capacitor that is isolated from the semiconductor substrate 102 by the first dielectric layer 104. A selective deposition of a silicide layer 108, such as Tantalum silicide ($Ta_2Si$), forms a resistive contact over the MCAP layer 106 and an integrated resistor 110.

A second dielectric layer 112, such as a silicon nitride (SiN) layer, SiON, or Ta2O5, is formed as a dielectric layer over the silicide layer 108 and the MCAP layer 106. The second dielectric layer 112 covers the integrated resistor 110 as well as the combination of the MCAP layer 106 and the silicide layer 108, which is deposited directly on and completely enclosing the MCAP layer 106 with no intervening material. A first metal layer 114 is deposited in selective areas, forming a top plate 115 and a terminal 113 in direct contact with the silicide layer 108 of integrated capacitor 116, a contact of the integrated resistor 110, and a bridge of an integrated inductor 118. A first insulation layer 120, such as a polyimide layer, benzocyclobutene (BCB), polybenzoxazole (PBO), or laminated solder dry film, is patterned across the surface of the integrated passive device system 100 with openings over the first metal layer 114 for further contact and distribution. A typical thickness of the first insulation layer 120 is approximately 5 µm.

An adhesion layer 122 is deposited to fill the openings in the first insulation layer 120. The adhesion layer 122 may be an alloy of titanium (Ti) or chromium (Cr) and is placed on the first metal layer 114. A barrier layer 124, such as nickel vanadium (NiV), CrCu, TiW, or TaN, covers all of the exposed areas of the adhesion layer 122 and is in the range from 500 Å to 3000 Å. The adhesion layer 122 forms the electrical path between the barrier layer 124 and the top plate 115, the contact of the resistor 110, and the bridge of the inductor 118. A second metal layer 126, such as a copper layer, is deposited on the barrier layer 124 and forms the body of the integrated inductor 118 and contacts of both the integrated resistor 110 and the integrated capacitor 116. The second metal layer 126 also forms the interconnects between the integrated resistor 110, the integrated capacitor 116, the integrated inductor 118, or the combination thereof to form an analog circuit. The second metal layer 126 can be over the metal layer and has a thickness in the range of 3.0 µm to 10.0 µm. The integrated capacitor may have a value of less than 1 pF due to the size of the top plate 115 and the thickness of the second dielectric layer 112.

A second insulation layer 128 may be made from a number of materials, such as polyimide, benzocyclobutene (BCB), polybenzoxazole (PBO), or other polymers. A typical thickness of the second insulation layer 128 is in the range from 8 µm to 16 µm. The second insulation layer 128 is spin-coated over the second metal layer 126 and forms an outer surface of the integrated passive device system 100, having openings over a contact 129 of the second metal layer 126.

An under ball material (UBM) 130 formed of a metal, such as chromium (Cr), chromium copper (CrCu), or copper (Cu). The UBM 130 provides a coupling between the second metal layer 126 and a system interconnect 132. The system interconnect 132 may be formed on the UBM 130 as a metal ball, a metal column or a metal stud bump. The metal used may be an alloy of aluminum, gold, or silver. The system interconnect 132 is utilized to physically couple the integrated passive device system 100 to the next level of a system, such as an integrated circuit (not shown).

The semiconductor substrate 102 is singulated in order to separate an analog device. The analog device may be an analog RF circuit, such as a filter, a discriminator, an amplifier, or the like.

Figure 2:
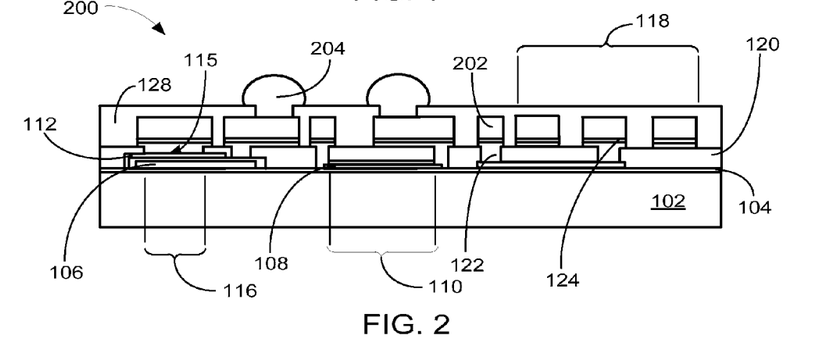
FIG. 2 is a cross-sectional view of the integrated passive device system, in an alternative embodiment of the present invention.

Referring now to FIG. 2, therein is shown a cross-sectional view of an integrated passive device system 200, in an alternative embodiment of the present invention. The cross-sectional view of the integrated passive device system 200 depicts the semiconductor substrate 102, such as a silicon wafer, having the first dielectric layer 104 formed over the surface of the semiconductor substrate 102. The first dielectric layer 104 may be a silicon dioxide ($SiO_2$) layer. Selective deposition of the MCAP layer 106, such as an aluminum alloy, forms the bottom plate of the metal-insulator-metal (MIM) capacitor and the bridge of the integrated inductor 118. A selective deposition of the silicide layer 108, such as Tantalum silicide ($Ta_2Si$), forms a resistive contact over the MCAP layer 106 and the integrated resistor 110.

The second dielectric layer 112, such as the silicon nitride (SiN) layer, is formed over the silicide layer 108. The second dielectric layer 112 covers the integrated resistor 110 as well as the combination of the MCAP layer 106 and the silicide layer 108. The first insulation layer 120, such as the polyimide layer, benzocyclobutene (BCB), polybenzoxazole (PBO), or laminated solder dry film, is patterned across the surface of the integrated passive device system 200 with openings over the MCAP layer 106, of the bridge of the integrated inductor 118 for further contact and distribution. The typical thickness of the first insulation layer 120 is approximately 5 μm.

The adhesion layer 122 fills the openings in the first insulation layer 120. The adhesion layer 122 may be an alloy of titanium (Ti) or chromium (Cr) and is placed on the first metal layer 114. The barrier layer 124, such as nickel vanadium (NiV), CrCu, TiW, or TaN, covers all of the exposed areas of the adhesion layer 122 and is in the range from 500 Å to 3000 Å thick. The adhesion layer 122 forms the top plate 115 of the integrated capacitor 116. An alternate metal layer 202, such as a copper layer, forms the body of the integrated inductor 118 and the contacts of both the integrated resistor 110 and the integrated capacitor 116. The alternate metal layer 202 has a thickness in the range of 3.0 μm to 10.0 μm. The integrated capacitor may have a value of less than 1 pF due to the size of the top plate 115 and the thickness of the second dielectric layer 112. The minimum size of the top plate 115 is 15 μm in diameter. The adhesion layer 122 or the first metal layer 114 can also be referred to as a conductive layer.

The second insulation layer 128 may be made from a number of materials, such as polyimide, benzocyclobutene (BCB), polybenzoxazole (PBO), or other polymers. The typical thickness of the second insulation layer 128 is in the range from 8 μm to 16 μm. The second insulation layer 128 forms an outer surface of the integrated passive device system 200, having openings over selected contacts of the alternate metal layer 202.

A solder interconnect 204, such as a solder ball, solder bump, solder column or stud bump, may be coupled to the alternate metal layer 202 through the openings in the second insulation layer 128. The solder interconnect 204 is utilized to physically couple the integrated passive device system 200 to the next level of the system, such as the integrated circuit (not shown).

Figure 3:
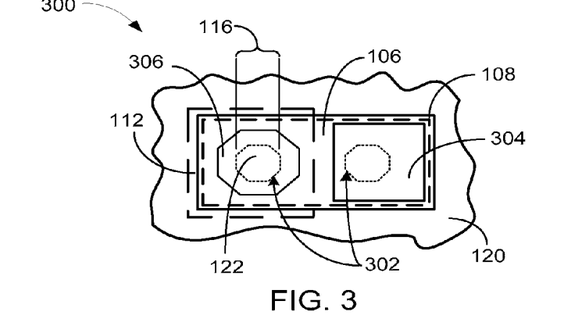
FIG. 3 is a top plan view of an integrated capacitor as implemented by the present invention.

Referring now to FIG. 3, therein is shown a top plan view of an integrated capacitor 300 as implemented by the present invention. The top plan view of the integrated capacitor 300 depicts the silicide layer 108, such as Tantalum silicide ($Ta_2Si$), forming the resistive contact over the MCAP layer 106. The second dielectric layer 112, such as the silicon nitride (SiN) layer, is formed over the silicide layer 108. An opening 302 in the first insulation layer 120 is filled with the adhesion layer 122, such as the alloy of titanium (Ti) or chromium (Cr). The value of the integrated capacitor 116 is determined by the area of the opening 302 over the second dielectric layer 112 and the thickness of the second dielectric layer 112. The area of the opening 302 has a minimum diameter of 15 μm.

A first capacitor contact 304 may be formed in the alternate metal layer 202, of FIG. 2, such as a copper layer. A second capacitor contact 306 may also be formed in the alternate metal layer 202. Both the first capacitor contact 304 and the second capacitor contact 306 may be used to couple the integrated capacitor 300 into a higher circuit (not shown).

Figure 4:
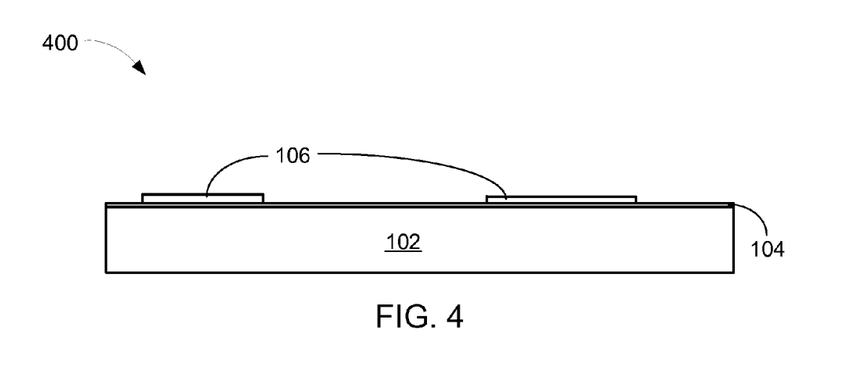
FIG. 4 is a cross-sectional view of a wafer structure in an MCAP deposition phase of manufacture, in an embodiment of the present invention.

Referring now to FIG. 4, therein is shown a cross-sectional view of a wafer structure 400 in an MCAP deposition phase of manufacture, in an embodiment of the present invention. The cross-sectional view of the wafer structure 400 depicts the semiconductor substrate 102 having a coating of the first dielectric layer 104 such as the silicon dioxide ($SiO_2$) layer. The MCAP layer 106 is deposited in select areas of the wafer structure 400. The MCAP layer 106, such as an alloy of aluminum is patterned to establish the relationship and physical position of the integrated capacitor 116 of FIG. 1 and the integrated inductor 118 of FIG. 1.

Figure 5:
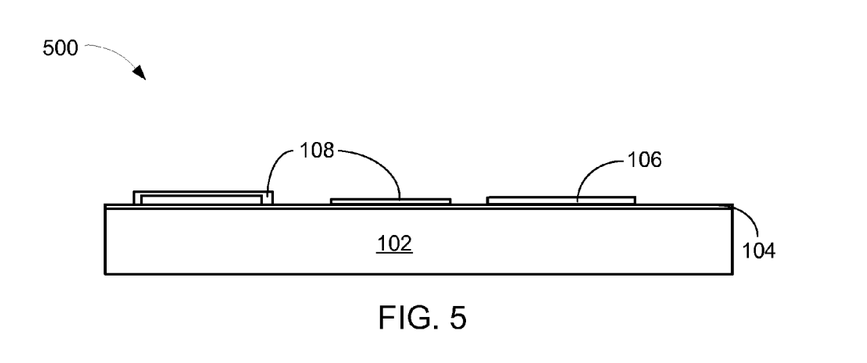
FIG. 5 is a cross-sectional view of the wafer structure of FIG. 4, in a silicide deposition phase of manufacture.

Referring now to FIG. 5, therein is shown a cross-sectional view of the wafer structure of FIG. 4, in a silicide deposition phase of manufacture. The cross-sectional view of the wafer structure of FIG. 4 depicts the silicide layer 108, such as Tantalum silicide ($Ta_2Si$), forming the resistive contact over the MCAP layer 106 and forming the resistive strip of the integrated resistor 110, of FIG. 1.

Figure 6:
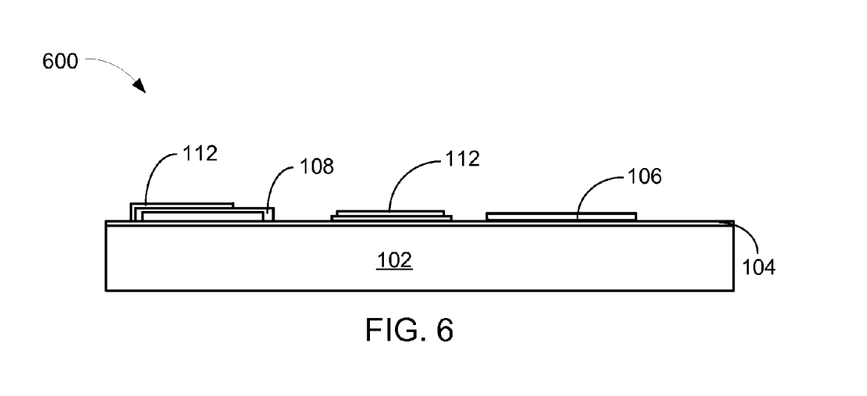
FIG. 6 is a cross-sectional view of the wafer structure of FIG. 5, in a dielectric layer forming phase of manufacture.

Referring now to FIG. 6, therein is shown a cross-sectional view of the wafer structure of FIG. 5, in the second dielectric layer 112 forming phase of manufacture. The cross-sectional view of the wafer structure of FIG. 5 depicts the second dielectric layer 112, of a material such as a silicon nitride (SiN), SiON, or $Ta_2O_5$, is formed over the silicide layer 108. The second dielectric layer 112 covers the integrated resistor 110 as well as the combination of the MCAP layer 106 and the silicide layer 108. The second dielectric layer 112 only partially covers the silicide layer 108. The area of the silicide layer 108 not covered by the second dielectric layer 112 will later be used to connect the integrated capacitor 116, of FIG. 1.

Figure 7:
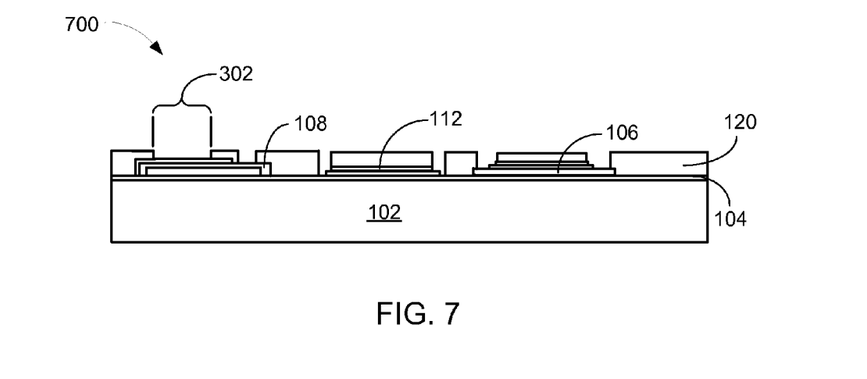
FIG. 7 is a cross-sectional view of the wafer structure of FIG. 6, in a first insulation layer deposition phase of manufacture.

Referring now to FIG. 7, therein is shown a cross-sectional view of the wafer structure of FIG. 6, in a first insulation layer deposition phase of manufacture. The cross-sectional view of the wafer structure of FIG. 6 depicts the first insulation layer 120 patterned over the wafer structure. Selective openings, such as the opening 302 are patterned in the first insulation layer 120.

Figure 8:
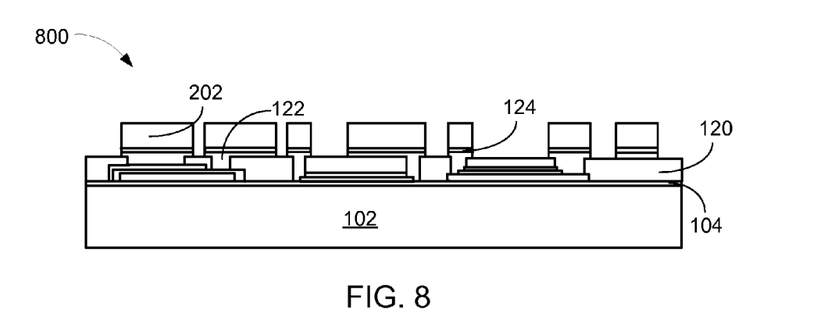
FIG. 8 is a cross-sectional view of the wafer structure of FIG. 7, in a metal deposition phase of manufacture.

Referring now to FIG. 8, therein is shown a cross-sectional view of the wafer structure of FIG. 7, in a metal deposition phase of manufacture. The cross-sectional view of the wafer structure of FIG. 7 depicts the adhesion layer 122 filling the openings that were patterned in the first insulation layer 120. The barrier layer 124, such as nickel vanadium (NiV), CrCu, TiW, or TaN, covers all of the exposed areas of the adhesion layer 122 and is in the range from 500 Å to 3000 Å thick. A thick coat of the alternate metal layer 202 covers the barrier layer 124. The thick coat of the alternate metal layer 202 may be greater than 5 μm thick.

Figure 9:
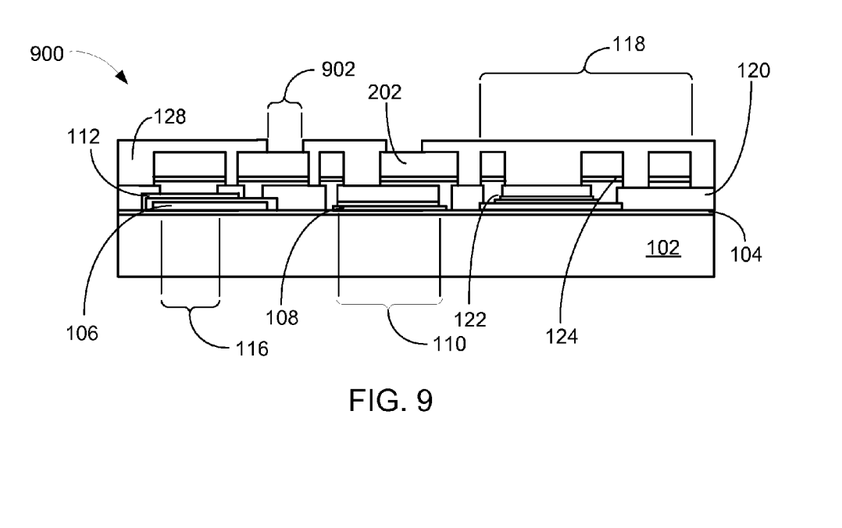
FIG. 9 is a cross-sectional view of the wafer structure of FIG. 8, in a second insulation layer deposition phase of manufacture.

Referring now to FIG. 9, therein is shown a cross-sectional view of the wafer structure of FIG. 8, in a second insulation layer deposition phase of manufacture. The cross-sectional view of the wafer structure of FIG. 8 depicts the second insulation layer 128, which may be made from a number of materials, such as polyimide, benzocyclobutene (BCB), polybenzoxazole (PBO), or other polymers. The typical thickness of the second insulation layer 128 is in the range from 8 μm to 16 μm. The second insulation layer 128 forms an outer surface of the integrated passive device system 200 of FIG. 2, having an interconnect via 902 over selected contacts of the alternate metal layer 202. The interconnect via 902 may be positioned anywhere across the surface of the wafer structure.

The structures of the integrated resistor 110, the integrated capacitor 116, and the integrated inductor 118 are evident at this point. Additional layers of copper interconnect are possible for very dense designs of the integrated passive device system 100.

Figure 10:
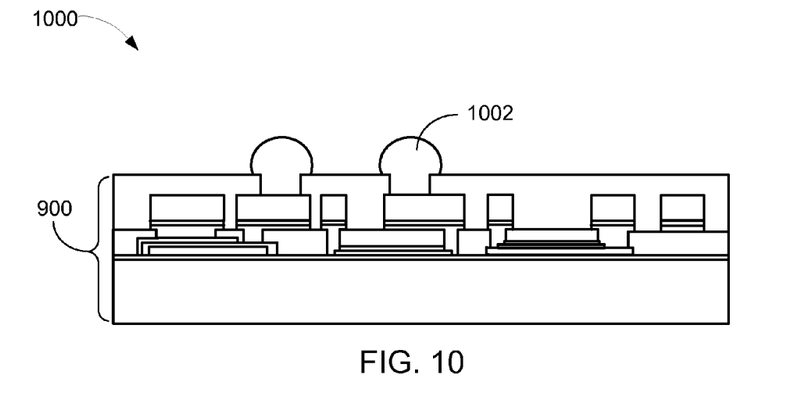
FIG. 10 is a cross-sectional view of the wafer structure of FIG. 9, in a solder bump forming phase of manufacture.

Referring now to FIG. 10, therein is shown a cross-sectional view of a wafer structure 900 of FIG. 9, in a solder bump forming phase of manufacture. The cross-sectional view of the wafer structure of FIG. 9 depicts the wafer structure 900 having a system interconnect 1002, such as a solder ball, a solder bump, a solder column, or a stud bump.

Figure 11:
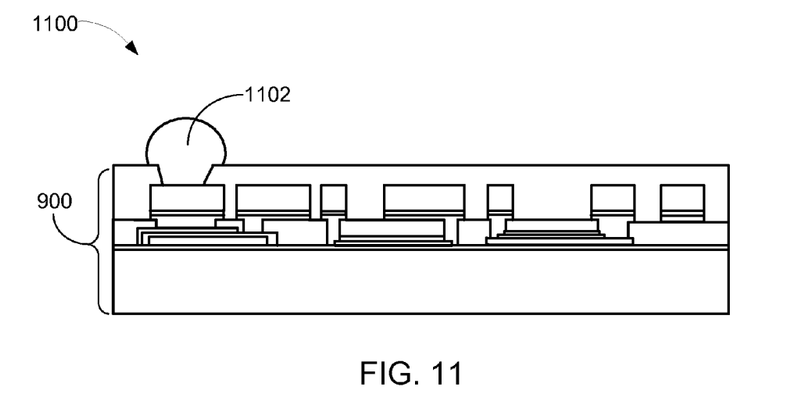
FIG. 11 is a cross-sectional view of the integrated passive device system, in another alternative embodiment of the present invention.

Referring now to FIG. 11, therein is shown a cross-sectional view of an integrated passive device system 1100, in another alternative embodiment of the present invention. The cross-sectional view of the integrated passive device system 1100 depicts the wafer structure 900 having a system interconnect 1102, such as a solder ball, solder bump, solder column, or stud bump positioned near the edge of the wafer structure 900.

Figure 12:
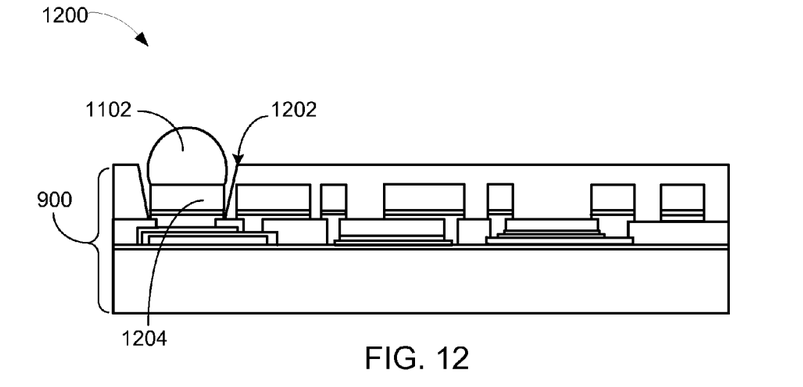
FIG. 12 is a cross-sectional view of the integrated passive device system, in yet another alternative embodiment of the present invention.

Referring now to FIG. 12, therein is shown a cross-sectional view of an integrated passive device system 1200, in yet another alternative embodiment of the present invention. The cross-sectional view of the integrated passive device system 1200 depicts the wafer structure 900 having a flared interconnect via 1202 that exposes a capacitor contact 1204. The system interconnect 1102 is positioned on the capacitor contact 1204.

Figure 13:
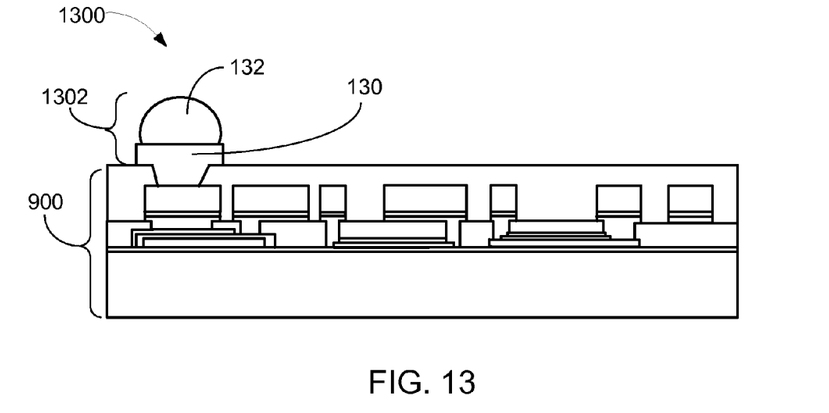
FIG. 13 is a cross-sectional view of the integrated passive device system, in yet another alternative embodiment of the present invention.

Referring now to FIG. 13, therein is shown a cross-sectional view of an integrated passive device system 1300, in yet another alternative embodiment of the present invention. The cross-sectional view of the integrated passive device system 1300 depicts the wafer structure 900 having a system interconnect 1302 positioned near the edge of the wafer structure 900. The system interconnect 1302 comprises the under ball material 130 and the system interconnect 132. The system interconnect 132 may be formed on the UBM 130 as a metal ball, a metal column or a metal stud bump. The metal used may be an alloy of aluminum, gold, or silver. The system interconnect 132 is utilized to physically couple the integrated passive device system 100 to the next level of a system, such as an integrated circuit (not shown).

Figure 14:
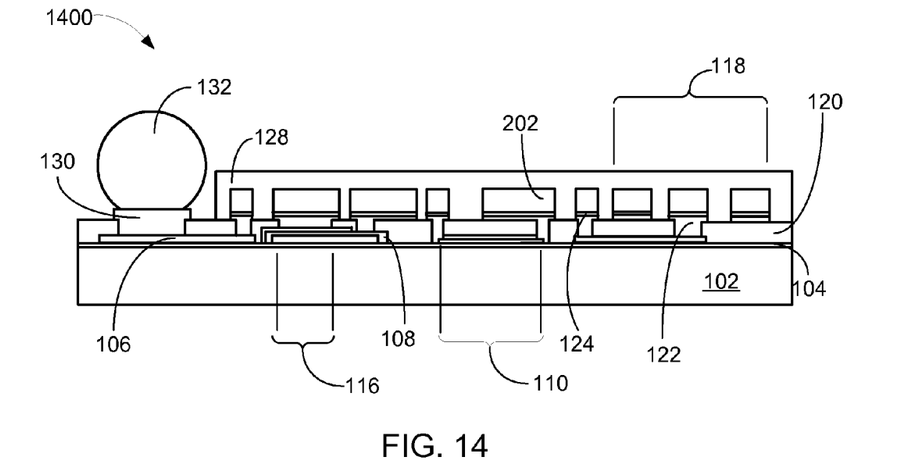
FIG. 14 is a cross-sectional view of the integrated passive device system, in still another alternative embodiment of the present invention.

Referring now to FIG. 14, therein is shown a cross-sectional view of an integrated passive device system 1400, in still another alternative embodiment of the present invention. The cross-sectional view of the integrated passive device system 1400 depicts the semiconductor substrate 102, such as a silicon wafer, having the first dielectric layer 104 formed over the surface of the semiconductor substrate 102. The first dielectric layer 104 may be a silicon dioxide ($SiO_2$) layer. Selective deposition of the MCAP layer 106, such as an aluminum alloy, forms the bottom plate of the metal-insulator-metal (MIM) capacitor, the bridge of the integrated inductor 118, and. A selective deposition of the silicide layer 108, such as Tantalum silicide ($Ta_2Si$), forms a resistive contact over the MCAP layer 106 and the integrated resistor 110.

The first insulation layer 120 is patterned with via openings. The adhesion layer 122 is used to fill the via openings in the first insulation layer 120. The barrier layer 124 is positioned between the adhesion layer 122 and the alternate metal layer 202. The second insulation layer 128 defines the surface of a flipchip BGA package. The MCAP layer 106 forms the base for the under ball material 130 and the system interconnect 132. The flipchip BGA package is designed to directly mount on a printed circuit board without using an under-fill material.

Figure 15:
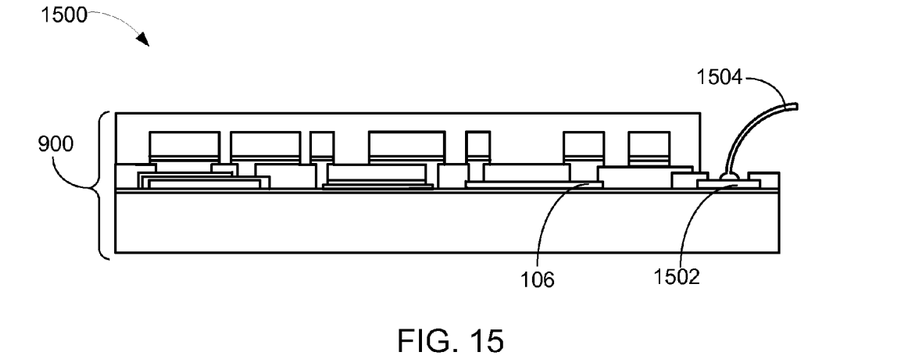
FIG. 15 is a cross-sectional view of the integrated passive device system, in still yet another alternative embodiment of the present invention.

Referring now to FIG. 15, therein is shown a cross-sectional view of an integrated passive device system 1500, in still yet another alternative embodiment of the present invention. The cross-sectional view of the integrated passive device system 1500 depicts the wafer structure 900 having a bond pad 1502 formed of and included in the MCAP layer 106. A system interconnect 1504 such as a gold bond wire may be used to attach the integrated passive device to the next level of system (not shown) and the system interconnect 1504 is formed in direct contact with the bond pad 1502.

Figure 16:
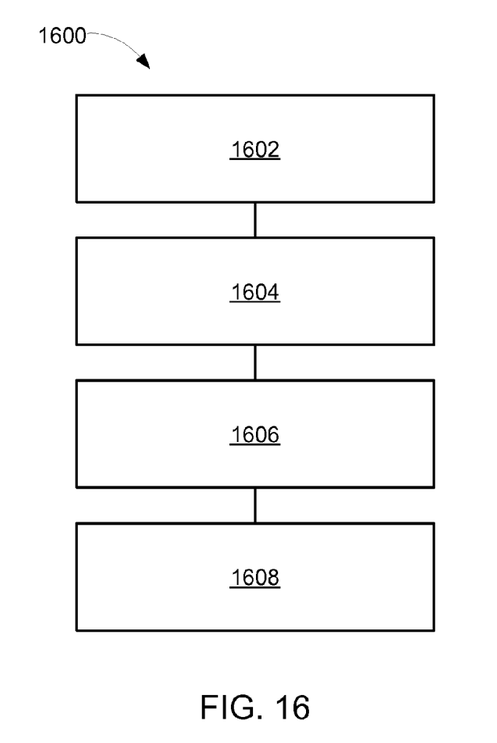
FIG. 16 is a flow chart of an integrated passive device system for manufacturing the integrated passive device system in an embodiment of the present invention.

Referring now to FIG. 16, therein is shown a flow chart of an integrated passive device system 1600 for manufacturing the integrated passive device system 100 in an embodiment of the present invention. The system 1600 includes forming a first dielectric layer over a semiconductor substrate in a block 1602; depositing a metal capacitor layer and a silicide layer on the first dielectric layer in a block 1604; forming a second dielectric layer over the metal capacitor layer and the silicide layer in a block 1606; and depositing a metal layer over the second dielectric layer for forming the integrated capacitor, an integrated resistor, an integrated inductor, or a combination thereof in a block 1608.

It has been unexpectedly discovered that the integrated passive device system may produce high Q factor inductors with low insertion loss while also producing capacitors with values of less that 1 pF in less than 10% of the space used by conventional means.

It has been discovered that the present invention thus has numerous aspects.

A principle aspect that has been unexpectedly discovered is that the present invention allows package integration of high quality analog circuits without impacting the integrated circuit die manufacturing process yield. By adding the analog adapter to the package, substrate, or printed circuit board, high volume wireless devices may be produced with better manufacturing yield.

Another aspect is the processes associated with the integrated passive device system produce thicker layers than would be possible with conventional processes. The use of copper in a single thick layer allows the production of integrated inductors that have high Q factors and low insertion loss.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated passive device system of the present invention furnishes important and heretofore unknown and unavailable solutions, capabilities, and functional aspects for manufacturing an analog adapter for wireless or cellular applications. The resulting processes and configurations are straightforward, cost-effective, uncomplicated, highly versatile and effective, can be surprisingly and unobviously implemented by adapting known technologies, and are thus readily suited for efficiently and economically manufacturing analog adapter devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated passive device system comprising:
   forming a first dielectric layer in direct contact with a semiconductor substrate;
   depositing a metal capacitor layer having a first segment and a second segment, each segment in direct contact with the first dielectric layer;
   depositing a silicide layer having a first portion and a second portion over the first dielectric layer and the metal capacitor layer, wherein:
      the first portion is in direct contact with the first dielectric layer between the first segment and the second segment, and
      the second portion is in direct contact with the second segment and the first dielectric layer, the second portion completely covering the second segment;
   forming a second dielectric layer having a first section and a second section over the metal capacitor layer, wherein:
      the first section is in direct contact with the first portion, the first section partially covering the first portion, and
      the second section is in direct contact with the second portion and the first dielectric layer, the second section partially covering the second portion;
   depositing a conductive layer over the second dielectric layer including:
      forming a top plate from the conductive layer for forming an integrated capacitor,
      forming a terminal for the integrated capacitor,
      forming a contact for an integrated resistor,
      forming a bridge for an integrated inductor, and
      forming an analog circuit by interconnecting the integrated capacitor, the integrated resistor, and the integrated inductor;
   applying a barrier layer over the conductive layer; and
   depositing a copper layer over the barrier layer.

2. The method as claimed in claim 1 further comprising depositing an insulation layer over the conductive layer.

3. The method as claimed in claim 1 further comprising forming a contact on the integrated capacitor includes:
   applying an insulation layer over the conductive layer;
   forming an interconnect via in the insulation layer for exposing the conductive layer; and
   forming a system interconnect coupled to the conductive layer.

4. A method of manufacturing an integrated passive device system comprising:
   forming a first dielectric layer in direct contact with a semiconductor substrate, the first dielectric layer includes a silicon dioxide layer;
   depositing a metal capacitor layer having a first segment and a second segment, each segment in direct contact with the first dielectric layer, the metal capacitor layer includes a first plate of an integrated capacitor;
   depositing a silicide layer having a first portion and a second portion over the first dielectric layer and the metal capacitor layer, wherein:
      the first portion is in direct contact with the first dielectric layer between the first segment and the second segment, and
      the second portion is in direct contact with the second segment and the first dielectric layer, the second portion completely covering the second segment;
   forming a second dielectric layer having a first section and a second section over the metal capacitor layer, wherein:
      the first section is in direct contact with the firs portion, the first section partially covering the first portion, and
      the second section is in direct contact with the second portion and the first dielectric layer, the second section partially covering the second portion;
   depositing a conductive layer over the second dielectric layer including:
      forming a top plate from the conductive layer for forming an integrated capacitor,
      forming a terminal for the integrated capacitor,
      forming a contact for an integrated resistor,
      forming a bridge for an integrated inductor, and
      forming an analog circuit by interconnecting the integrated capacitor, the integrated resistor, and the integrated inductor;
   applying a barrier layer over the conductive layer; and
   depositing a copper layer over the barrier layer.

5. The method as claimed in claim 4 further comprising:
   depositing the second dielectric includes depositing the second dielectric layer over the silicide layer.

6. The method as claimed in claim 4 wherein depositing the conductive layer includes forming a body of the integrated inductor and contacts of both the integrated resistor and the integrated capacitor with the conductive layer.

7. The method as claimed in claim 4 further comprising depositing an insulation layer over the conductive layer by spin-coating a polyimide layer.

8. The method as claimed in claim 4 further comprising forming a contact on the integrated capacitor includes:
   applying an insulation layer over the conductive layer includes spin-coating a polymer layer;
   forming an interconnect via in the insulation layer for exposing the conductive layer includes exposing the conductive layer or the metal capacitor layer; and
   forming a system interconnect includes coupling a solder ball, a solder column, a stud bump, or a bond wire coupled to the conductive layer.

9. An integrated passive device system comprising:
   a semiconductor substrate;
   a first dielectric layer in direct contact with the semiconductor substrate;
   a metal capacitor layer having a first segment and a second segment, wherein each segment is in direct contact with the first dielectric layer;
   a silicide layer having a first portion and second portion over the first dielectric layer and the metal capacitor layer, wherein:
      the first portion is in direct contact with the first dielectric layer between the first segment and the second segment, and
      the second portion is in direct contact with the second segment and the first dielectric layer, the second portion completely covering the second segment;
   a second dielectric layer having a first section and a second section over the metal capacitor layer, wherein:
      the first section is in direct contact with the first portion, the first section partially covering the first portion, and the second section is in direct contact with the second portion and the first dielectric layer, the second section partially covering the second portion;

a conductive layer over the second dielectric layer including:
- a top plate from the conductive layer for forming an integrated capacitor,
- a terminal from the conductive layer for the integrated capacitor,
- a contact from the conductive layer for an integrated resistor,
- a bridge from the conductive layer for an integrated inductor, and
- an analog circuit by interconnecting the integrated capacitor, the integrated resistor, and the integrated inductor with the conductive layer;

a barrier layer over the conductive layer; and a copper layer over the barrier layer.

10. The system as claimed in claim 9 further comprising an insulation layer over the conductive layer.

11. The system as claimed in claim 9 further comprising a contact on the integrated capacitor includes:
- an insulation layer over the conductive layer;
- an interconnect via formed in the insulation layer for exposing the conductive layer; and
- a system interconnect coupled to the conductive layer.

12. The system as claimed in claim 9 wherein the first dielectric layer is a silicon dioxide layer.

13. The system as claimed in claim 12 wherein the conductive layer includes a body of the integrated inductor and contacts of both the integrated resistor and the integrated capacitor.

14. The system as claimed in claim 12 further comprising an insulation layer over the conductive layer includes a polyimide layer.

15. The system as claimed in claim 12 further comprising a contact on the integrated capacitor includes:
- an insulation layer over the conductive layer includes a polymer;
- an interconnect via in the insulation layer for exposing the conductive layer includes the conductive layer or the metal capacitor layer exposed; and
- a system interconnect including a solder ball, a solder column, a stud bump, or a bond wire coupled to the conductive layer.

* * * * *